United States Patent [19]
Kulkarni et al.

[11] Patent Number: 5,903,170
[45] Date of Patent: May 11, 1999

[54] DIGITAL LOGIC DESIGN USING NEGATIVE DIFFERENTIAL RESISTANCE DIODES AND FIELD-EFFECT TRANSISTORS

[75] Inventors: Shriram Kulkarni; Pinaki Mazumder; George I. Haddad, all of Ann Arbor, Mich.

[73] Assignee: The Regents of the University of Michigan, Ann Arbor, Mich.

[21] Appl. No.: 08/868,270

[22] Filed: Jun. 3, 1997

[51] Int. Cl.$^6$ .................................................. K03K 19/10
[52] U.S. Cl. .............................. 326/134; 326/119; 326/95
[58] Field of Search ........................ 326/95–98, 130–135, 326/112, 119, 121

[56] References Cited

U.S. PATENT DOCUMENTS

| | | | |
|---|---|---|---|
| 3,248,563 | 4/1966 | Lin ........................................... | 326/134 |
| 3,517,210 | 6/1970 | Rubenstein ................................ | 326/97 |
| 3,857,046 | 12/1974 | Varadibriarwood et al. ............. | 326/97 |
| 3,982,138 | 9/1976 | Luisi et al. ................................ | 326/97 |
| 3,987,311 | 10/1976 | Thornburg . | |
| 4,982,356 | 1/1991 | Ando . | |
| 5,018,107 | 5/1991 | Yoshida .................................... | 326/112 |
| 5,260,609 | 11/1993 | Takatsu . | |
| 5,265,044 | 11/1993 | Singh . | |
| 5,281,871 | 1/1994 | Mori et al. . | |
| 5,294,566 | 3/1994 | Mori . | |
| 5,336,949 | 8/1994 | Mimura . | |
| 5,477,169 | 12/1995 | Shen et al. . | |

OTHER PUBLICATIONS

Chen et al.: "Monolithic Integration of Resonant Tunneling Diodes and FET's for Monostable–Bistable Transition Logic Elements (MOBILE's), " IEEE Electron Device Letters, vol. 16, No. 2, Feb. 1995, pp. 70–73.

Seabaugh et al.: "Co–Integrated Resonant Tunneling and Heterojunction Bipolar Transistor Full Adder, 3" Proceedings of the 1993 IEEE International Electron Devices Meeting, Washington, D.C., 1993, pp. 16.4.1–16.4.4.

Neil H.E. Weste and Kamran Eshraghian: "Principles of CMOS VLSI Design: A Systems Perspective" 2nd edition, Addison–Wesley Publishing Company, Reading, Massachusetts, 1993, pp. 3–21.

Chang et al.: "Analysis of Hetrojunction Bipolar Transistor/Resonant Tunneling Diode Logic for Low–Power and High––Speed Digital Applications," IEEE Transactions on Electron Devices, vol. 40, No. 4, Apr. 1993, pp. 685–691.

Williamson et al., "12 GHz Clocked Operation of Ultralow Power Interband Resonant Tunneling Diode Pipelined Logic Gates," IEEE Journal of Solid–State Circuits, vol. 32, No. 2, Feb. 1997, pp. 222–231.

*Primary Examiner*—Jon Santamauro
*Assistant Examiner*—Don Phu Le
*Attorney, Agent, or Firm*—Harness, Dickey & Pierce, P.L.C.

[57] ABSTRACT

A digital logic gate circuit including a logic block, clock transistor, bias transistor and a negative differential resistance (NDR) diode which acts as an active load for the circuit. The logic block, comprising a plurality of field effect transistors whose control terminals receive the set of input signals to the logic gate, determines the gate function such as inversion, NAND, NOR, MAJORITY, etc. The clock transistor is connected in series with the logic block and the bias transistor is connected in parallel across this series combination. The terminal of the NDR diode affixed to the common terminal of the bias transistor and the logic block forms the output for the logic circuit. NDR diodes include but are not limited to devices such as tunnel diodes and resonant tunneling diodes (RTDs). The folded I-V characteristic of an NDR diode allows the circuits to operate in a bistable clocked mode, where the circuit output latches its state and changes only when the clock signal is active. The circuit topology allows logic functions to be implemented in a compact manner, thus reducing the propagation delay for the signals, and reducing the overall complexity and delay of arbitrary logic circuits. Thus, performance improvements result from the compactness of logic design as well as the elimination of a pipeline latch area and delay overheads.

27 Claims, 3 Drawing Sheets

Fig-3
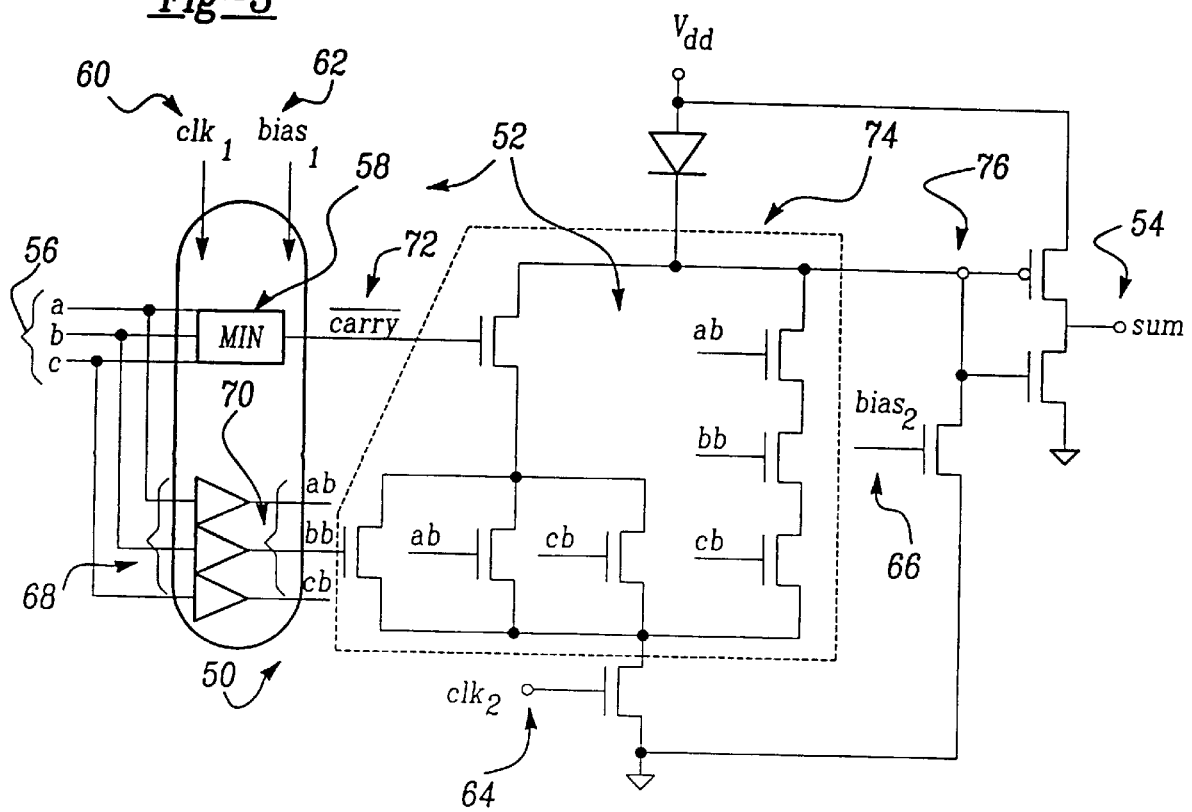
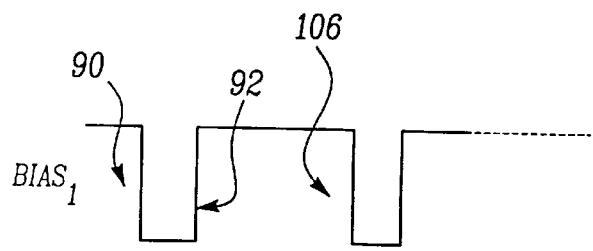
Fig-4A
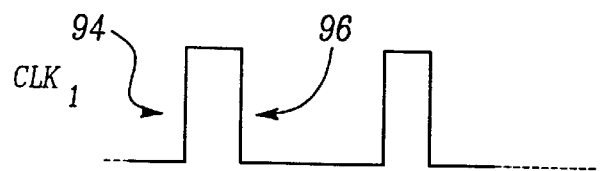
Fig-4B
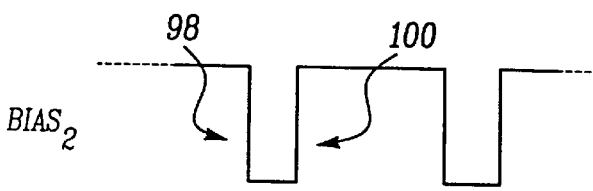
Fig-4C
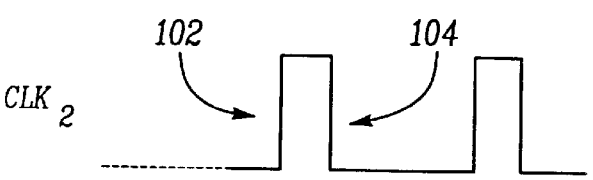
Fig-4D

5,903,170

DIGITAL LOGIC DESIGN USING NEGATIVE DIFFERENTIAL RESISTANCE DIODES AND FIELD-EFFECT TRANSISTORS

This invention was made with government support under grant DAAH04-93-G-0242 awarded from the Advanced Research Projects Agency. The government has certain rights in the invention.

BACKGROUND OF THE INVENTION

1. Field of the Invention

The present invention relates to digital logic gates. More particularly, the present invention relates to digital logic gate designs using negative differential resistance diodes and metal oxide semiconductor field effect transistors (MOSFETs) or heterostructure field effect transistors.

2. Background Information

Digital logic gates typically incorporate p-type metal oxide semiconductor (MOS) transistors which are used for precharging and storage in dynamic complementary metal oxide semiconductor (CMOS) logic. Dynamic CMOS circuits are susceptible to noise due to capacitive coupling or leakage current from MOSFETs. These phenomena adversely affect circuit operation since the circuit output is not held by a conducting MOSFET on removal of the input signal. Another problem with dynamic CMOS gates is charge sharing which reduces the output high voltage possibly causing logic errors.

Prior quantum circuit approaches have used (negative differential resistance (NDR) diodes) along with resistive loads for logic function implementation. This results in high power dissipation and also the use of precision resistors increases the size of the circuit since resistors are not easily fabricated in an integrated form using small areas.

Other circuits have been proposed which use bipolar transistors in conjunction with NDR diodes such as resonant tunneling diodes. While these circuits possess high operating speed, they have the disadvantage of high power dissipation and low noise margins due to low voltage swings. These circuits are difficult to design since the loading effect of the subsequent inputs on the output of a logic gate can change the circuit function.

Bistable mode circuits, in earlier quantum circuit technologies, typically require a multi-phase (AC) power supply that is used to periodically reset/evaluate a gate. This has the disadvantage of requiring an AC power supply which determines the maximum frequency of operation. Conventional circuit techniques, such as CMOS, use discrete latching elements to achieve bistable mode operation. The addition of the latching elements results in increased circuit size and delay.

Thus, there is a need for a high performance digital logic gate which is reliable and less susceptible to noise. There is also a need for a digital logic gate which has a high speed of operation, small size, and low power dissipation. There is a further need for a digital logic gate which operates in the bistable operation mode without requiring an AC power supply or discrete latching elements.

SUMMARY OF THE INVENTION

The digital logic gates of the present invention, also referred to as quantum MOS or QMOS logic gates, include bistable mode circuits using negative differential resistance (NDR) diodes and metal oxide semiconductor field effect transistors (MOSFETs). The NDR diode, which acts as a pull up load and latching element, eliminates the need for pMOS transistors used in prior dynamic logic gates for precharging and storage. The NDR diode helps eliminate some of the problems associated with prior designs by continually maintaining the output node voltage at a value dictated by the logic at the time of evaluation. The faster switching speed of NDR diodes also increases the speed of operation of the logic gates of the present invention allowing compact, higher speed implementations having improved power-delay products over conventional implementations.

NDR diodes include but are not limited to devices such as tunnel diodes and resonant tunneling diodes (RTDs). The folded current-voltage characteristic of an NDR diode allows the circuits of the present invention to operate in the bistable clocked mode, where the circuit output latches its state and changes only when the clock signal is active. The circuit topology allows logic functions to be implemented in a compact manner, thus reducing the propagation delay for the signals, and reducing the overall complexity and delay of arbitrary logic circuits. Thus, performance improvements result from the compactness of logic design as well as the elimination of pipeline latch areas and delay overheads.

In the present invention, MOS transistors are used in conjunction with NDR diodes. The use of MOS transistors eliminates the loading effects of cascaded logic gates as well as results in reduced power dissipation. The elimination of resistors results in a more practical implementation which is not limited by the physical size of integrated resistors. High power dissipation due to the use of resistors is also eliminated. Furthermore, the use of MOS devices allows for high integration levels and compatibility with existing CMOS technology.

The digital logic gates of the present invention use DC power supplies. This eliminates the dependence on the frequency of operation of AC power supplies normally associated with prior designs. Furthermore, the logic of the present invention operates in a bistable operation mode and it is possible to design more robust and reliable circuits than threshold mode bistable quantum effect circuits. The present invention can be used to implement inverters, NAND gates, NOR gates, MAJORITY/MINORITY gates, and complex gates (full adder) as well as a variety of other logic gates.

A particular realization of the digital logic circuit presented in this invention is a logic gate that performs the NOR function on a pair of input signals. It includes a pair of field effect transistors, designated as input transistors, connected in parallel that have common first and second current terminals, and each of the field effect transistors further has a control terminal connected to receive a logic signal. The circuit also includes a negative differential resistance device with two terminals, one of which is connected to the first common current terminal of the pair of field effect transistors. The other terminal of the negative differential resistance device is connected to a direct current power supply.

The logic gate also includes a field effect transistor, designated as the clock transistor, connected between the second common terminal of the pair of field effect transistors and the ground terminal. This field effect transistor has a control terminal that can receive a logic signal input. Another field effect transistor, designated as the bias transistor, is connected between the first common terminal of the pair of field effect transistors and the ground terminal, further having a control terminal that can receive a logic signal input. The negative differential resistance device operates approximately at the valley point when the bias transistor is turned ON and the clock transistor is OFF. The negative resistance device operates above the peak current when one or both input transistors are ON and the clock transistor is ON. The negative differential resistance device operates below the valley current when both the clock transistor and the bias transistor are turned OFF.

Further objects, features, and advantages of the present invention will become apparent from a consideration of the following description and the appended claims when taken in connection with the accompanying drawings.

BRIEF DESCRIPTION OF THE DRAWINGS

FIG. 3 is a schematic diagram of a quantum MOS bistable full adder circuit of the present invention;

FIGS. 4a–4d are a graphical representation of the clocking scheme for the circuit of FIG. 3.

DETAILED DESCRIPTION OF THE PREFERRED EMBODIMENT

Preferred embodiments of the digital logic gate design of the present invention are described herein below with reference to the drawings.

Figure 1:
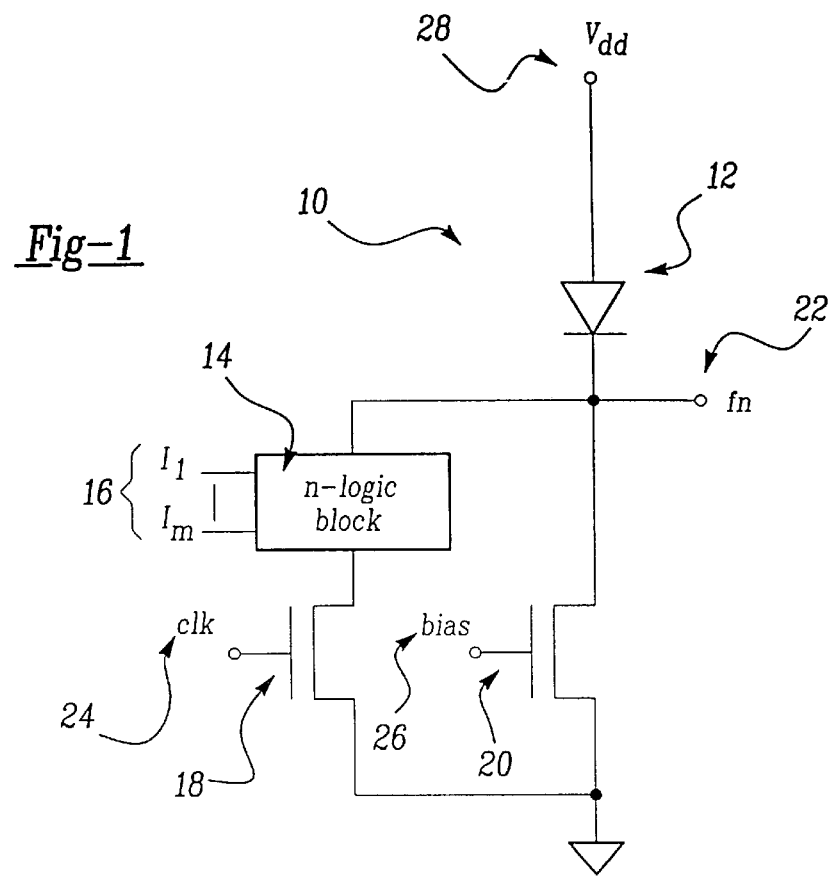
FIG. 1 is a schematic diagram of a quantum MOS bistable logic gate of the present invention.

Referring now to FIG. 1, a digital logic gate according to the present invention is indicated generally at 10. Logic gate 10 includes an NDR diode 12, such as a resonant tunneling diode (RTD), which forms the active load in the circuit. Moreover, the NDR diode 12 may also include an Esaki diode.

One terminal of NDR diode 12 is connected to terminal 28, adapted to have a potential source $V_{dd}$ attached to it. A logic block 14, including inputs 16, determines the circuit function. A clock transistor 18 is included to control the evaluation of logic gate 10. A bias transistor 20 maintains quiescent current through NDR diode 12 while also controlling the precharging of the gate output 22. The common terminal of the clock transistor 18 and the bias transistor 20 are connected to a reference terminal, which in this embodiment is ground.

The logic block 14 may consist of various series and/or parallel combinations of enhancement mode field effect transistors (FETs) which have a control terminal that can receive logic signals to form the set of inputs 16. For example, a logic block could consist of a pair of field effect transistors connected in parallel with two logic signal inputs to form a bistable NOR gate as mentioned previously. A logic block consisting of a pair of field effect transistors connected in series, each with a controlling input that can receive logic signals, would perform a NAND operation on the two input signals.

Moreover, the logic block 14 may consist of various series and/or parallel combinations of enhancement mode heterostructure field effect transistors. Specifically, the clock transistor 18 and the bias transistor 20 may include being enhancement mode MOSFETs or an enhancement mode heterostructure field effect transistors.

Due to the NDR characteristics of NDR diode 12, which is used as a pull up load, logic gate 10 has the ability to remember the state of the circuit without use of additional circuitry such as a latch. Previous state of the art logic families do not provide self-latching gates; a separate latch is required at the output of a combinational gate to achieve this result. Such a separate latch typically uses at least eight additional transistors. This results in increased size of the circuit and added delay of the latch. The latch overheads of delay and size are eliminated in the logic gate design of the present invention.

Pipelining is a means of speeding up any computation. An existing combinational block is divided into several sequential stages such that each stage performs a different operation during a particular clock cycle. The drawback of pipelining is that each computation takes the same or more time as the nanopipelining technique of the present invention, but there is an added penalty in the area devoted to the pipeline latches in the circuit. Consider a combinational block that is composed on n stages with each stage having a delay of $t_c$. This results in a total delay of $n*t_c$. We could partition the combinational block into k stages from 1 to n, where each stage output is latched. If we assume a latch delay of $t_l$, the maximum delay of the circuit is now $(n*t_c/k+t_l)$. The throughput of the circuit increases from $1/(n*t_c)$ to $1/(n*t_c/k+t_l)$ but the latency increases from $(n*t_c)$ to $n(t_c+t_l)$. Also, if $a_c$ is the area of the combinational block; after pipelining, the area of the circuit increases to $a_c+k*m*a_l$, where $a_l$ is the area of a latch and m is the number of latches at each output of each combinational stage.

However, if all combinational stages do not have latches at the same delay, then the maximum achievable throughput with the use of separate pipeline latches is $1/(b*t_c+t_l)$ where $b*t_c$ is the longest combinational stage delay. If the latch delay $t_l$ is much larger than the longest combinational delay $b*t_c$, it places an upper bound on the maximum achievable throughput of the pipelined circuit. Thus, pipelining using conventional logic results in direct trade-offs between the area of the pipeline latch and the achievable throughput. The use of bistable NDR devices in designing circuits improves the performance of nanopipelined circuits over conventional pipelined circuits because the latch delay, $t_l$, equals zero. Also, if latency is not of concern, each logic gate can operate in the bistable mode resulting in maximum possible throughput.

NDR diodes, such as resonant tunneling diodes, exhibit a tunneling characteristic that results in a rapid transition between the two positive differential resistance (PDR) regions in which logic gates of the present invention have stable operating points. These switching times, in the order of a few picoseconds, are much faster than conventional transistors made in silicon or GaAs. Due to the inherent fast switching characteristic of NDR diode 12, the new logic structures have higher operating speeds than conventional circuits. For example, the use of an RTD pull up load (with n-type MOS transistors) results in faster switching times when compared to a CMOS structure using the same n-type MOS transistors as above with equivalent p-type MOS transistors. Thus, there is an inherent improvement in switching speed of the circuit of the present invention that is a direct result of the tunneling phenomenon of NDR diode 12 as opposed to faster speeds due to process improvements. Analytical switching delay analysis has resulted in the following expressions being obtained for the rise time ($t_r$) and fall time ($t_f$) of a QMOS inverter.

$$t_r = R_{p1}C_l \ln\left(\frac{V_p}{0.1V_{dd}}\right) +$$

-continued $$t_f = R_{p1}C_l \ln\left(\frac{I_t R_{p1}}{I_t R_{p1} - V_p}\right) + $$
$$\frac{|R_n|C_l \ln\left(\frac{I_p|R_n| + V_p - V_v}{I_p|R_n|}\right) + R_{p2}C_l \ln\left(\frac{V_{dd} - V_v + I_v R_{p2}}{I_v R_{p2}}\right)}{}$$
$$\frac{|R_n|R_t}{|R_n| - R_t}C_l \ln\left(\frac{R_t I_v + V_v - V_{dd}}{R_t I_p + V_p - V_{dd}}\right) + \frac{R_{p2}R_t}{R_{p2} + R_t}C_l \ln\left(\frac{R_t I_v - V_v - V_{dd}}{R_t I_p - V_f - V_{dd}}\right)$$

where, $$\left(I_t = \frac{\beta_{bias}}{2}(V_{dd} - V_t)^2\right), \left(R_t = \frac{1}{\beta_n(V_{dd} - V_t)}\right)$$

Figure 2:
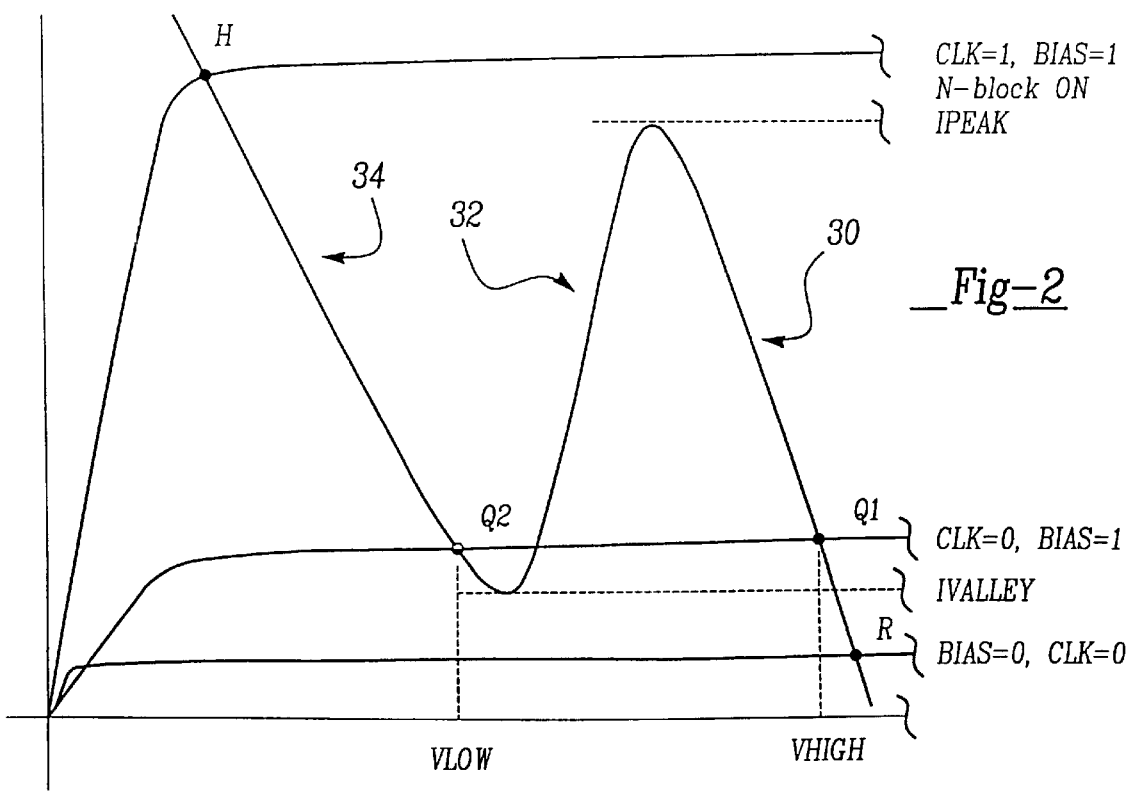
FIG. 2 is a graphical representation of the load lines for the bistable mode operations of the logic gate of FIG. 1.

As compared to dynamic CMOS circuit topologies, the logic family of the present invention offers better reliability due to the fact that the output voltage level is continually restored by NDR diode 12. The QMOS circuits of the present invention ameliorate charge sharing problems associated with dynamic CMOS logic. The circuits of the present invention do not operate in the current summing mode, such as in ECL gates, and hence noise margins are higher for the logic family of the present invention. The theoretical noise margin analysis for the logic family of the present invention is provided in the following expressions for the high and low noise margins of a QMOS inverter:

$$NM_H = V_{dd} - V_p + \left(I_p - \frac{\beta_{bias}}{2}(V_{dd} - V_{tn})^2\right)R_{p1} - $$
$$V_{tn} - \sqrt{\frac{(2I_p - \beta_{bias}(V_{dd} - V_{tn})^2}{\beta_n}}$$

$$NM_L = V_{tn} + \sqrt{\frac{2I_p - \beta_{bias}(V_{dd} - V_{tn})^2}{\beta_n}} - $$
$$(V_{dd} - V_v) + \left(\frac{\beta_{bias}}{2}(V_{dd} - V_{tn})^2 - I_v\right)R_{p2}$$

where:

$V_p$=RTD peak voltage,
$V_v$=RTD valley voltage,
$V_f$=RTD forward voltage,
$I_p$=RTD peak current,
$I_v$=RTD valley current,
$R_{p1}$=RTD positive differential resistance in region 1,
$R_{p2}$=RTD positive differential resistance in region 3,
$R_n$=RTD negative differential resistance,
$\beta_n$=N-transistor block gain,
$\beta_{bias}$=Bias transistor gain,
$C_l$=Effective load capacitance
$V_{tn}$=Threshold voltage, and
$V_{dd}$=Supply voltage FIG. 2 illustrates the load line for logic gate 10. Switching of bias transistor 20 is used to reset the state of logic gate 10 or to maintain a quiescent current through NDR diode 12 which is between its peak and valley currents. In this quiescent state, the NDR diode 12 operates in the first positive differential resistance (PDR) region 30. Clock transistor 18 is designed such that if logic block 14 is turned ON, turning clock transistor 18 ON will cause the current through NDR diode 12 to exceed its peak current value thus switching the state of gate output 22.

The sequential operation of logic gate 10 is enumerated herein below. As inputs 16 change, clock signal 24 into clock transistor 18 is held low thus preventing evaluation of output 22 by logic block 14. Bias signal 26 goes low forcing the current through NDR diode 12 to zero. When the current falls below the valley current of NDR diode 12, output 22 is pulled high, as shown by point R in FIG. 2. Next, bias signal 26 goes back high with output 22 remaining high. At this point, the current through NDR diode 12 is the quiescent current and the circuit operating point changes to $Q_1$ as shown in FIG. 2.

When clock signal 24 goes high, if inputs 16 are such that logic block 14 is turned ON, then turning clock transistor 18 ON causes the current through NDR diode 12 to exceed its peak current causing a jump across the NDR region 32 to the second PDR region 34 of the current-voltage characteristic corresponding to the situation where the voltage across NDR diode 12 is greater than the valley voltage of NDR diode 12. This results in output 22 going low with the circuit operating at point H as shown in FIG. 2. If logic block 14 is not turned ON, no current flows through logic block 14 and current through the NDR diode 12 remains at its quiescent value. The circuit remains operating at point Q1 in the first PDR region of NDR diode 12 where the voltage across NDR diode 12 is less than the peak NDR voltage and output 22 remains high.

Clock signal 24 goes low so that no current flows through logic block 14. The voltage at output 22 reaches a stable level corresponding to whether NDR diode 12 was in the first PDR region (operating at point Q1) or the second PDR region 34 (operating at point Q2) in the previous step of the sequence.

Using the proposed logic gates, a full adder, indicated generally at 50, can be implemented as a two-stage logic block 52 as shown in FIG. 3. For correct operation of full adder 50 as a true-bistable logic gate, bias and clock pulses are used as mentioned hereinabove. However, when multiple gates are cascaded as in the implementation of full adder 50, output 54 is evaluated after all inputs 70 to the second stage have been correctly evaluated. This requires a multi-phase evaluation scheme in which each gate is evaluated in a different phase than its inputs. For the preferred embodiment, a two-phase clocking scheme is used in order that cascaded logic stages may be evaluated correctly. The inverted majority function 58 that gives the complemented carry output 72 is evaluated in Phase 1, consisting of a clock signal denoted by $clk_1$ 60, and a bias signal denoted by $bias_1$ 62. The sum logic block 74 is evaluated in Phase 2, consisting of a clock signal denoted by $clk_2$ 64 and a bias signal denoted by $bias_2$ 66. The sum logic block 74 consists of series and parallel combinations of FETs that utilize the complemented carry output 72 and buffered adder inputs 70 to generate the complementary sum output 76. The various clock and bias signals used to reset and evaluate the full adder 50 are illustrated in FIG. 4. Each clock phase consists of a bias pulse followed by an evaluation clock pulse in accordance with the operation sequence of the bistable gates discussed earlier.

FIG. 4a shows the signal $bias_1$ 62. On the falling edge 90 of $bias_1$ 62, the complemented carry output 72 of the inverted majority function 58, is reset to logic high. The rising edge 92 of $bias_1$ 62 may occur before or after the rising edge 94 of $clk_1$ 60, shown in FIG. 4b, but must be prior to the falling edge 96 of $clk_1$ 60. At the rising edge 94 of $clk_1$ 60, the complemented carry output 72 is evaluated in accordance with the logic levels of the inputs 56. At the falling edge 96 of $clk_1$ 60, the complemented carry output 72 is latched and remains at this value until it is reset to logic high by the occurrence of the next falling edge 106 of $bias_1$ 62. After the falling edge 96 of $clk_1$ 60, the inputs 70 to the sum logic block 74 are available for use.

The occurrence of falling edge 98 of $bias_2$ 66, shown in FIG. 4c, after the falling edge 96 of $clk_1$ 60, causes the sum output 54 to be reset to logic high. The rising edge 100 of $bias_2$ 66 may occur before or after the rising edge 102 of $clk_2$ 64, shown in FIG. 4d, but must be prior to the falling edge 104 of $clk_2$ 64. At the rising edge 102 of $clk_2$ 64, the complemented sum output 76 is evaluated in accordance with the values of inputs 70 and the complemented sum output 76 is evaluated in accordance with the values of inputs 70 and the complemented carry output 72. At the falling edge 104 of $clk_2$ 64, the complemented sum output 76 is latched. The two phases of the clock should be non-overlapping to maintain correct functionality. Bistable buffers 68 clocked on Phase 1 are used to synchronize inputs 70 to the sum stage of the circuits. The full adder 50 of the present invention has a simulated frequency of operation of 1 GHz, while corresponding fully CMOS bistable adders typically operate at around 333 MHz.

Figure 5:
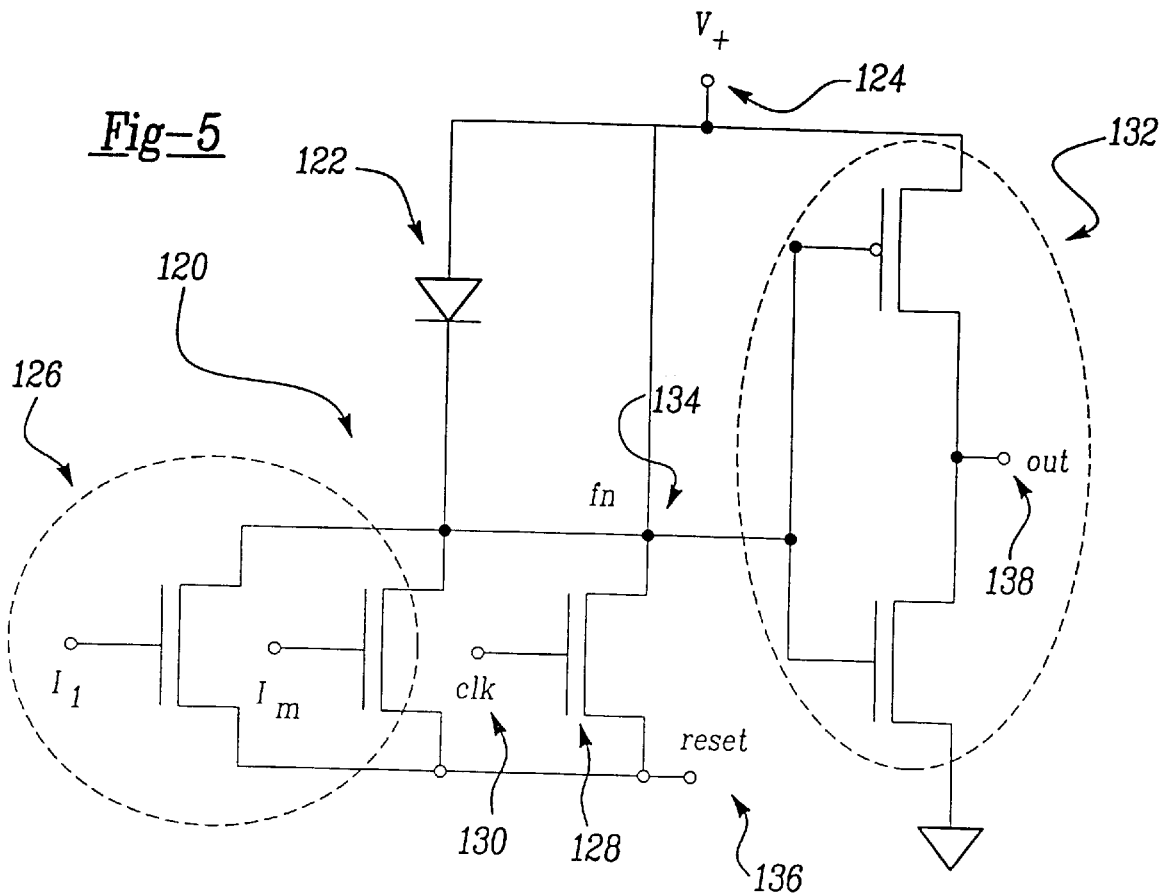
FIG. 5 is a schematic diagram of an alternative embodiment of the present invention illustrating a threshold mode implementation of quantum MOS logic.

As an alternative to the above-described embodiments, the present invention could also be operated in the threshold mode with a circuit configuration as shown in FIG. 5. The threshold mode circuit is generally indicated at 120. It consists of an NDR diode 122 connected to a terminal 124 capable of receiving a potential source input. The NDR diode 122 may include being an Esaki diode.

The other terminal of the NDR diode 122 is connected to a set of input transistors 126 and a clock transistor 128. The function output 134 is buffered by an inverter 132 to provide the output signal 138. Reset line 136 is connected to the other end of the set of input transistors 126 and the clock transistor 128. The set of input transistors 126 may consist of one or more transistors connected in parallel with control inputs that form the set of inputs to the logic gate.

Consider that the set of input transistors 126 has m transistors providing a set of logic inputs $I_1, I_2, \ldots I_m$. Let the threshold value of the gate be n, where $n \leq m$. This means that on evaluation of the gate, the function output 134 will be logic high if fewer than n inputs to the set of input transistors 126 are logic high whereas it will be logic low if n or more inputs to the set of input transistors 126 are logic high. The output signal 138 is a combinational inversion of the function output 134. Table 1 illustrates the relation between some commonly utilized digital logic gate functions and their threshold values.

TABLE 1

Relationship between gate function and threshold value

| Gate | No. of Inputs (m) | Threshold (n) |
|---|---|---|
| Inverter | 1 | 1 |
| 2-input NOR | 2 | 1 |
| 2-input NAND | 2 | 2 |
| 3-input NOR | 3 | 1 |
| 3-input inverted MAJORITY | 3 | 2 |
| 3-input NAND | 3 | 3 |

The operating sequence of logic circuit 120 is illustrated herein below. Reset line 136 is set to logic high. This causes the set of input transistors 126 and clock transistor 128 to turn OFF. The current through the NDR diode 122 falls below the valley current and hence the function output 134 goes high. The reset line 136 is then returned to a logic low state. The function output 134 continues to remain at logic high since the clock signal 130 is held to a voltage level such that the quiescent current through the NDR diode 122 is approximately equal to the valley current. The function output 134 is evaluated in accordance with the values of the input signals $I_1$ through $I_m$ when the clock signal 130 is set high. The transistor sizes are designed such that if fewer than n inputs to the set of input transistors 126 are at logic high, then on the arrival of the evaluate pulse on the clock signal 130, the current through the NDR diode 122 does not exceed the peak current and the NDR diode 122 continues to operate in the first positive differential resistance region 30 of its current-voltage characteristic. In such a circumstance, when the clock signal 130 returns to its quiescent value, the function output 134 continues to remain logic high. If however, n or more inputs to the set of input transistors 126 are logic high, then on arrival of the clock signal 130, the current through the NDR diode 122 exceeds the peak current and the NDR diode switches to the second positive differential resistance region 34 of its current-voltage characteristic. In this situation, when the clock signal 130 returns to its quiescent value, the function output 134 becomes logic low. When the clock signal 130 is in the quiescent state, any changes in the input signals $I_1$ through $I_m$ do not cause the RTD current to go above the peak current or fall below the valley current and hence the logic state of the function output 134 is maintained at the value of the last evaluation. The function output 134 is thus latched.

An alternative means of operating the logic circuit 120 requires the reset line 136 to be tied to the ground reference voltage. The circuit can then be reset by means of a pulse on clock signal 130 that goes below the quiescent clock voltage at the time that the pulse on the reset line 136 would have appeared as in the above description. This would require a complex clock waveform but would eliminate the high drive requirements of a global reset line.

It is to be understood that the invention is not limited to the exact construction illustrated and described above, but that various changes and modifications may be made without departing from the spirit and scope of the invention as defined in the following claims.

What is claimed is:

1. A digital logic gate circuit, having an input and an output, said logic gate circuit comprising:

a negative differential resistance diode configured to form an active load and provide a latching function in said logic gate circuit;

a logic block, configured to accept the input and determine said logic gate circuit function;

clock means for producing a clock signal for controlling the evaluation timing of said logic block;

bias means for maintaining a quiescent current through said negative differential resistance diode and for precharging the output of said logic gate circuit, and wherein the output latches its state and changes only when said clock signal is active.

2. The circuit of claim 1 wherein said logic gate circuit is configured to operate in a bistable clocked mode.

3. The circuit of claim 1 wherein said clock means comprises a clock transistor which is an enhancement mode MOSFET.

4. The circuit of claim 1 wherein said clock means comprises a clock transistor which is an enhancement mode heterostructure field effect transistor.

5. The circuit of claim 1 wherein said bias means comprises a bias transistor which is an enhancement mode MOSFET.

6. The circuit of claim 1 wherein said bias means comprises a bias transistor which is an enhancement mode heterostructure field effect transistor.

7. The circuit of claim 1 wherein the negative differential resistance diode includes a resonant tunneling diode.

8. The circuit of claim 1 wherein the negative differential resistance diode includes an Esaki diode.

9. The circuit of claim 1 wherein said logic block is configured to perform an inverting function.

10. The circuit of claim 9 wherein said logic block includes one field effect transistor to perform said inverting function.

11. The circuit of claim 1 wherein said logic block is configured to perform a NANDing function.

12. The circuit of claim 11 wherein said logic block includes field effect transistors connected in series to perform said NANDing function.

13. The circuit of claim 1 wherein said logic block is configured to perform a NORing function.

14. The circuit of claim 13 wherein said logic block includes field effect transistors connected in parallel to perform said NORing function.

15. The circuit of claim 1 wherein said logic block is configured to perform a full adder function.

16. The circuit of claim 1 wherein said logic block comprises a plurality of enhancement mode MOSFETs.

17. The circuit of claim 1 wherein said logic block comprises a plurality of enhancement mode heterostructure field effect transistors.

18. The circuit of claim 1 wherein said logic gate circuit is powered by a DC power supply.

19. The circuit of claim 1 wherein said bias means is switched to reset the state of said logic gate circuit.

20. The circuit of claim 1 wherein said negative differential resistance diode exhibits a tunneling current-voltage characteristic that results in a transition from a first positive differential resistance region to a second positive differential resistance region through an unstable negative differential resistance region when the voltage across the negative differential resistance diode is swept from 0 to a second forward voltage.

21. A digital logic gate circuit, having an input and a function output, said logic gate circuit comprising:
   a negative differential resistance diode configured to form an active load and provide a latching function in said logic gate circuit;
   a set of input transistors connected to said negative differential resistance diode for accepting said input; and
   a clock means connected to said negative differential resistance diode and to said set of input transistors for controlling evaluation of said logic gate,
   wherein said function output is produced based upon said input to said set of input transistors and upon said clock signal, said function output being latched by said negative differential resistance diode, said function output being changed when said clock signal is active.

22. The circuit of claim 21 wherein said set of input transistors has a plurality of field effect transistors connected in parallel.

23. The circuit of claim 22 further comprising:
   reset means connected to said set of input transistors and to said clock means for resetting said logic gate.

24. The circuit of claim 23 further comprising:
   ground reference voltage means being connected to said reset means whereby said logic gate circuit is reset by providing a pulse to said clock means.

25. The circuit of claim 21 wherein said negative differential resistance diode is connected to a potential source.

26. The circuit of claim 21 wherein said negative differential resistance diode is a resonant tunneling diode.

27. The circuit of claim 21 wherein said negative differential resistance diode is an Esaki diode.

* * * * *